Feb. 7, 1967 D. R. KERR ET AL 3,303,059
METHODS OF IMPROVING ELECTRICAL CHARACTERISTICS
OF SEMICONDUCTOR DEVICES AND
PRODUCTS SO PRODUCED
Filed June 29, 1964 2 Sheets-Sheet 1

INVENTORS
DONALD R. KERR
DONALD R. YOUNG
BY Everett A. Gartrell
ATTORNEY

United States Patent Office 3,303,059

Patented Feb. 7, 1967

3,303,059

METHODS OF IMPROVING ELECTRICAL CHARACTERISTICS OF SEMICONDUCTOR DEVICES AND PRODUCTS SO PRODUCED

Donald R. Kerr, Hopewell Junction, and Donald R. Young, Poughkeepsie, N.Y., assignors to International Business Machines Corporation, New York, N.Y., a corporation of New York Filed June 29, 1964, Ser. No. 378,862
13 Claims. (Cl. 148—1.5)

The present invention is directed to methods of improving one or more electrical characteristics of semiconductor devices and to those improved devices. More particularly, the invention relates to methods of improving the usefulness of various semiconductor devices such as by imparting desirable electrical characteristics during fabrication, reducing leakage current, increasing reverse-voltage breakdown and current gain.

The so-called planar semiconductor devices which have one or more junctions that extend to a predetermined surface are being manufactured very widely today. Such devices include a passivating layer of insulating material covering the exposed junction or junctions and the surface regions adjacent thereto. Planar semiconductor devices of a material such as silicon commonly retain on a surface thereof a layer of silicon dioxide which not only serves as a diffusion mask during fabrication procedures but also functions thereafter as a passivating layer for protecting the device surfaces and junctions from contamination. A layer of this type has advantages such as being a good insulator and passivating medium, and possesses fabrication compatibility and chemical stability. However, a surface potential develops in the semiconductor adjacent the interface of the insulating layer and the semiconductor member, which potential is not necessarily optimum under conditions of applied bias at the usual temperatures encountered during operation of the device. As a result, the performance of the device is not always ideal.

It is an object of the present invention, therefore, to provide a new and improved method of improving one or more electrical characteristics of a semiconductor device.

It is another object of the invention to provide a new and improved method of permanently fixing the surface potential of a semiconductor member of a semiconductor device over its operating temperature range.

It is a further object of the invention to provide a new and improved method of permanently fixing the surface potential of a semiconductor member of a semiconductor device over its operating temperature range, which member has a passivating layer intimately secured to a surface thereof.

It is an additional object of the present invention to provide a new and improved method of permanently fixing the surface potential of a semiconductor member of a semiconductor PN junction device over its operating temperature range, which member has a passivating layer of silicon dioxide disposed on a surface thereof.

It is yet another object of the invention to provide a new and improved method of permanently fixing, over the operating temperature range of a semiconductor device, the surface potential present at the interface of a semiconductor member of the device and a passivating layer of glass disposed on that member.

It is a still further object of the present invention to provide a new and improved method of modifying one or more electrical characteristics of a semiconductor PN junction device having a passivating layer secured to a surface of a semiconductor member of the device.

It is yet another object of the invention to provide a new and improved semiconductor device.

In accordance with a particular form of the invention, the method of improving at least one electrical characteristic of an electrical device which includes a semiconductor member and an insulating layer selected from the class consisting of glass and silicon oxide contiguous therewith comprises heating the member and the layer to a temperature at least 50° C. higher than the operating temperature range of the device. The method also includes applying a potential to an electrode on the insulating layer to produce at the aforesaid higher temperature in the layer an electrical field of an intensity effective permanently to fix over the aforesaid operating range the surface potential of the member adjacent the interface of the member and the layer, and cooling the member and the layer to at most a temperature in the aforesaid operating range.

The foregoing and ther objects, features and advantages of the invention will be apparent from the following more particular description of preferred embodiments of the invention, as illustrated in the accompanying drawings.

Figure 1A:
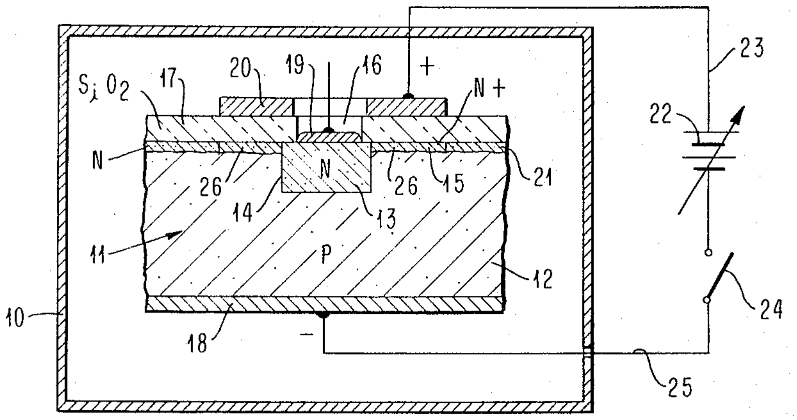
FIG. 1A is a diagrammatic representation of an apparatus for practicing the invention on one form of a semiconductor diode which is shown in vertical section.

*Description of FIG. 1A semiconductor device and apparatus*

Referring now more particularly to FIG. 1A of the drawings, there is represented schematically apparatus which may be employed in practicing the method of the present invention. That apparatus includes a suitable heater such as an oven 10 which is capable of heating a semiconductor device such as a semiconductor diode 11 to an elevated temperature which is significantly higher than the operating temperature range of the diode. To that end, the oven is one which can heat the diode to a temperature of about 350–400° C. and maintain it thereat for an extended period of time such as for an hour or more, as may be required. In lieu of an oven, an electrical heater block has been employed with success.

The semiconductor diode 11 represented in FIG. 1A may be one of the planar type which includes a semicon- of to create a PN junction 14 that has a portion which ductor body or member 12, ordinarily of a high resistivity P conductivity type having a region or member 13 of the N conductivity type diffused into the upper surface there- extends to the upper surface 15 of the device. The resistivity of member 12 may be of the order of 10 ohm cm. The member 13 may be created in a conventional manner as by diffusing an N-type significant impurity such as phosphorus through an aperture 16 in an impervious layer 17 of an inert insulating material that may also serve as a surface passivation and diffusion mask. While the semiconductor members 12 and 13 of the diode may be made of a suitable semiconductor material such as germanium, silicon or an intermetallic semiconductor compound, for the purpose of this description and those which follow of various semiconductor devices, those members will be considered to be of silicon. The insulating layer 16 may be in the form of an oxide coating such as silicon dioxide in intimate engagement with the surface 15 of the diode 11 and having a thickness of the order of 5000–20,000 angstroms, thicknesses of 5000–7000 angstroms being typical. Layer 17 may be formed on the surface 15 as by heating the diode between 900–1400° C. in an oxidizing atmosphere saturated with water vapor or steam. Alternatively, it may be formed by heating the diode in the vapors of an organic siloxane compound such as tetraethoxysilane at a temperature below the melting point of the member but above that at which the siloxane decomposes so that the inert layer 17 of silicon dioxide coats the desired surface 15. The aperture 16 is etched through a selected portion of the layer 17 so as to exposed part of the surface of the member 13 by wel-known photoengraving techniques. It will be observed that in the diffusion operation mentioned above, the impurity forming the member 13 creeps or diffuses for a short distance under the etched portions of the silicon dioxide layer 17 which defines the aperture 16.

Ohmic connections in the form of the usual electrodes 18 and 19 are applied in a conventional manner to the exposed portions of members 12 and 13 as by evaporation, sputtering or plating. The semiconductor diode thus far described is a typical prior-art device. An area-type auxiliary electrode 20 is applied as by evaporation to the silicon dioxide layer 17, preferably over the outwardly extending portion of the PN junction 14 and also over a substantial portion of the adjacent P-type member 12. For the purpose of this description, it will be assumed that the electrode 20 is an annular one surrounding but insulated from the electrode 19 by the silicon dioxide layer 17. It will be understood, however, that the electrode 20 could have other suitable geometry depending upon the geometry of the semiconductor member 13. For purposes to be explained subsequently, a voltage source such as a battery 22 has its positive terminal connected to the electrode 20 on the insulating layer 17 through a connection 23 while its negative terminal is connected through a switch 24 and a connection 25 to the electrode 18 for the semiconductor member 12.

In passivating the surface 15 of the semiconductor device 11 containing the high-resistivity P-type member 12 with the silicon dioxide layer 17 and in protecting the junction 14 from contamination where it comes to that surface, particularly when the junction is produced by diffusion techniques, it has been found that an acumulation of negatively charged carriers may be created in the region of the interface of the silicon dioxide film 17 and the silicon member 12, those negatively charged carriers appearing as a surface potential in the surface portion of the silicon member 12 near its surface 15. In that surface portion of the P-type region 12, the surface potential or carriers are considered to manifest themselves in a manner which may be represented as a thin N-type skin or channel 21, sometimes discontinuous, which extends from the N-type region 13 to the side portions of the device. While the channel favorably influences the reverse-voltage breakdown of the diode for reasons explained in an article by C. G. B. Garrett and W. H. Brattain appearing in the Journal of Applied Physics, vol. 27, No. 3, March 1956 at pages 299–306 and entitled "Some Experiments on and a Theory of Surface Breakdown," for some applications it is desirable to improve upon or increase this breakdown voltage. At this time it appears desirable to point out that, while but a single diode has been represented, in a fabrication operation several hundred are ordinarily fabricated simultaneously on a single semiconductor wafer which is then severed so as to create several hundred discrete diodes of the type represented.

*Explanation of operation of apparatus of FIG. 1A*

In practicing the method of the present invention, the diode is heated by an oven 10 for an extended period of time such as an hour or more at a temperature which is significantly higher than the diode operating temperature range of about 75–100° C. A temperature in the range of 50–250° C. above the operating temperature of the device may be employed depending, for example, upon factors such as the material of the layer 17. For a silicon dioxide layer, a temperature of 150° C. has proved useful although higher temperatures which are below the melting point of the silicon may also be employed. With the device at the selected elevated temperature at the start of the heating cycle, the switch 24 is closed. This produces in the silicon dioxide layer 17 approximately normal to its surface and thickness an electric field of an intensity effective permanently to fix over the operating temperature range of the diode the surface potential member 12 adjacent the interface of that member and the layer 17. The magnitude of the voltage selected for application to terminals 18 and 20 is ordinarily directly proportional to the thickness of the layer 17. For a silicon dioxide layer having a thickness of the order of 5000–20,000 angstroms, a voltage in the range of 10–30 volts applied over a heating interval of about one hour has proved to be satisfactory for producing the necessary electric field. Biasing voltages of the order of a few volts supplied by the source 22 have also been employed with sucess with thin silicon dioxide layers. In general, the duration of the interval of the temperature-bias treatment just described is inversely proportional to the magnitude of the elevated temperature. Consequently, the time interval for the treatment can be reduced by employing a higher temperature which is compatible with the materials of the semiconductor diode.

At the end of the heating interval, the diode 11 is withdrawn from the oven and placed on a heat-absorbing member which cools the device to a temperature that is at most in the operating temperature range of the diode. Ordinarily, the device is cooled to room temperature. The biasing source 22 preferably is connected to the electrodes 18 and 20 during the cooling period of the temperature cycle. It is believed that during the interval of the described temperature-bias treatment when the semiconductor diode is at an elevated temperature above the usual diode operating temperature, the electric field established in the insulating layer 17 induces a change in the electric charge present in the body of that layer. This charge, which is not too well understood, adjusts or modifies the surface potential of the P-type semiconductor member 12 adjacent its surface 15, i.e., it modifies the hole and/or electron density in the surface portion of the member 12 adjacent the insulating layer 17. Expressed somewhat differently, the electric field applied to the insulating layer 17 in conjunction with the elevated temperature is believed to produce a change in the insulating layer which in turn produces a useful effect that becomes fixed in the semiconductor member 12, namely an interface or surface potential which differs from that which existed prior to the temperature-bias treatment. When the now cooling semiconductor diode 11 is cooled to its operating temperature or to room temperature, this new value of surface potential developed in the semiconductor member 13 persists or remains locked in that member. Thereafter, when the diode 11 is operated in a temperature range below the temperature to which the device was subjected during the temperature-bias treatment, this new surface potential remains stable.

The change in surface potential in the member 12 from the temperature-bias treatment so increases the accumulation of negatively charged carriers in the N-type skin 21 at the surface of member 12 underlying the electrode 20 that it may be looked upon as establishing an $N^+$ region 26 in that portion of the skin. While this may tend to increase the leakage current of the device somewhat, it materially and desirably increases the reverse-voltage breakdown of the junction. Curve A represents the current-junction voltage characteristic of a conventional diode corresponding to that of FIG. 1A which has not been subjected to the temperature-bias method of the present invention. It will be observed from the curve that the current has a low value for low values of junction voltage, and that the current rises suddenly at breakdown which occurs at an intermediate value of voltage. Curve B, on the other hand, represents the same characteristic for a similar diode which has received the temperature-bias treatment of this invention prior to its use or operation in the usual manner. It will be noted that the junction breakdown desirably occurs at a considerably higher voltage, electrode 20 not being connected in circuit during such operation.

Figure 1C:
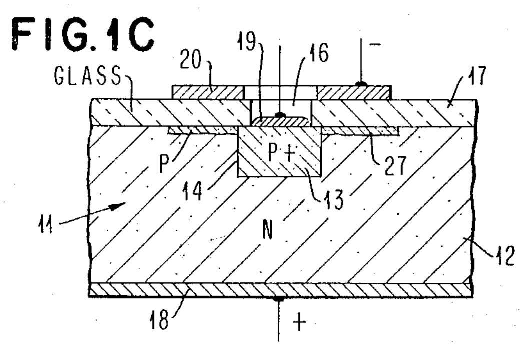
FIG. 1C is a vertical sectional view of another semiconductor diode on which the method of the present invention may be practiced.
Figure 1B:
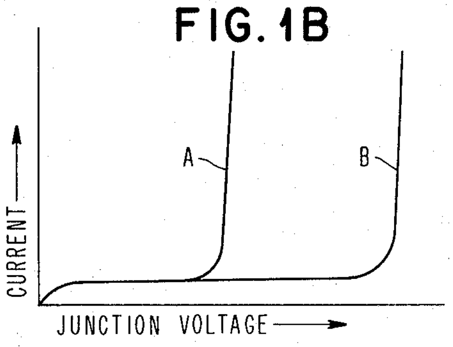
FIG. 1B is a pair of curves employed in explaining the benefical results of the method of the present invention.

*Description of FIG. 1C semiconductor diode*

The semiconductor diode of FIG. 1C is very similar to that of FIG. 1A, differing primarily in that the position of the P-type and N-type members are reversed and also in the composition of the passivating layer. Accordingly, the corresponding elements in the two figures are designated by the same reference numerals. Member 12 ordinarily is of a high resistivity N-type silicon while the member 13 is a low resistivity P-type silicon. The insulating layer is a glass of the type which can be applied directly to the surface 15 if the diode without an intervening silicon dioxide layer and without impairing the quality of the PN junction 14 where it comes to that surface. Such a passivating glass, which is capable of remaining stable at the device operating temperature, is disclosed and claimed in the copending application of Helen M. Hoogendoorn and Seymour Merrin, Serial No. 341,212, filed January 30, 1964, entitled "Glasses for Encapsulating Semiconductor Devices and Resultant Devices" and assigned to the same assignee as the present invention. Briefly, such a glass consists essentially in mol percent of PbO 23–50, $Al_2O_3$ 0–19, $B_2O_3$ 6–18, $SiO_2$ 33–65 and 0.1–1.0 mol percent of an oxide from the group consisting of niobium pentoxide, zirconium dioxide, titanium dioxide and pentalum pentoxide. The glass may be applied in powdered form by a suitable sedimentation procedure and then fuse at an elevated temperature to form a hole-free glass layer, after which the aperture 16 is opened by conventional etching procedures. The glass is preferably applied by the procedure described and claimed in U.S. Patent 3,212,921 of William A. Pliskin and Ernest E. Conrad, Serial No. 141,668, filed September 29, 1961, entitled "Method of Forming Glass Film on an Object and Product Produced Thereby," and assigned to the same assignee as the present invention. Briefly this technique comprises centrifuging the diode together with finely divided particles of the glass mentioned above in a fluid having a dielectric constant in the range of 3.4 to 20.7 to deposit on the surface of the diode a layer of glass particles, and then heating the device and the layer above the softening point of the particles for a time sufficient to fuse them and produce the thin hole-free glass layer 17 preferably having a thickness of a few to several microns. Electrodes 18, 19 and 20 are applied to the various members as represented in FIG. 1C. The electrode 20 is biased negatively with respect to the semi-conductor member 12. In the absence of a temperature-bias treatment, it has been found that an inversion layer similar to the N-type inversion layer or channel 21 of FIG. 1A but of the opposite conductivity type is not formed at the surface of the N-type member 12 of FIG. 1C.

To improve an electrical characteristic of the semiconductor diode of FIG. 1C, a negative bias of about 20 volts is applied to the auxiliary electrode 20 while the diode is maintained for about an hour at a temperature in the range of 250–300° C., after which the device is cooled. A negative space charge produced in the glass layer 17 is believed to establish a positive space charge or surface potential in the silicon member 12 underlying the electrode 20 and just below the interface of the member 12 in the glass layer 17. This surface potential in turn permanently establishes in member 12 below the interface, where indicated, a P-type inversion layer 27 which, while it may tend slightly to increase the capacitance of the diode appearing between the electrodes 18 and 19 during the normal operation thereof, materially improves the reverse-voltage breakdown of the device. This improved characteristic thereafter remains stable during subsequent operation of the device.

It has been found that the beneficial P-type inversion layer 27 cannot be formed just below the surface of the N-type member 12 by a temperature-bias treatment when a silicon dioxide layer is employed in lieu of the glass layer 17. On the other hand, the glass mentioned above forming the layer 17 of FIG. 1C may be employed in the environment in FIG. 1A in place of the silicon dioxide layer with satisfactory results.

Figure 2:
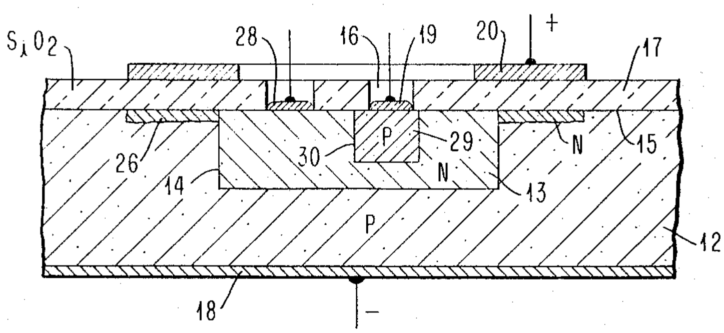
FIG. 2 is a vertical sectional view of a PNP transistor which benefits from the method of the invention.

*Description of transistor of FIG. 2*

Referring now to FIG. 2 of the drawings, there is represented a PNP transistor such as one of the planar type which has constructional features similar to those of the semiconductor diode of FIG. 1A. Accordingly, corresponding ones of the various elements in the two figures just mentioned are designated by the same reference numerals. Members 12 and 13 constitute the collector and base regions of the transistor 11. A base electrode 28 is connected to member 13 in a conventional manner. Diffused into the base member or region 12 is a typical P-type emitter region or member 29 forming an emitter-base junction 30 therebetween. The passivating layer 17 covering the surface 15 and the junctions 14 and 30 where they extend to the surface is of silicon dioxide. A passivating glass of the type mentioned above in connection with FIG. 1C may also be employed for layer 17.

A temperature-bias treatment such as the one previously described wherein the auxiliary electrode 20 is given a positive bias with respect to the collector member 12 permanently fixes the surface potential of that portion of the semiconductor member 12 underlying the electrode 20 so as to establish an N-type inversion layer 26 just under the interface as represented. This desirably increases the collector-base breakdown characteristic of the transistor, a feature which ordinarily is very difficult to attain in a PNP planar transistor. This improvement greatly offsets the slight increase which may result in the collector-to-base capacitance as a result of the increase in the effective width of the base region 13. Electrode 20 is not connected in circuit during normal operation of the transistor.

Figure 3A:
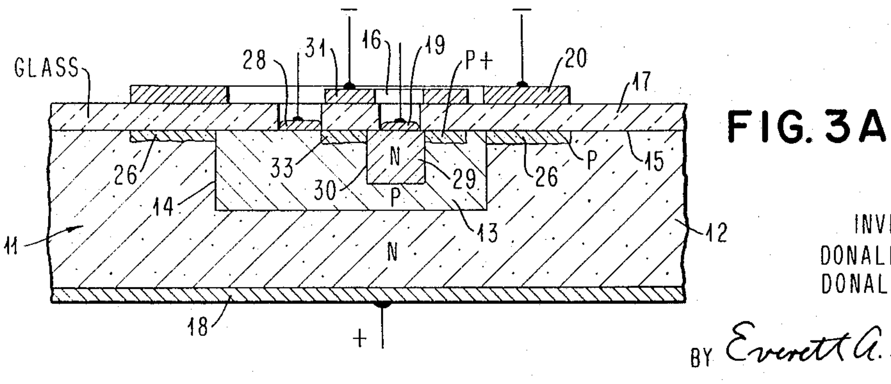
FIG. 3A is a similar view of an NPN transistor which demonstrates improved characteristics when treated in accordance with the method of the present invention.

*Description of transistor of FIG. 3A*

In FIG. 3A there is represented an NPN transistor of the planar type which has features similar to those of the PNP transistor of FIG. 2 and the semiconductor diodes of FIGS. 1A and 1C. For convenience of understanding, corresponding elements in the three figures are identified by the same reference numerals. The passiavting layer 17 which covers the surface 15 and the junctions 14 and 30 extending to that surface is made of a glass such as that forming the layer 17 of FIG. 1C. In addition to the annular auxiliary electrode 20 which rests on the glass layer 17 and spans the upwardly extending portion of the collector-base junction 14 and overlies a portion of the N-type collector member 12, the transistor includes a second and smaller annular auxiliary electrode 31 which rests on the layer 17, spans the upwardly projecting portion of the emitter-base junction 30 and overlies a portion of the P-type base region 13.

The temperature-bias treatment of the invention may be employed to improve at least one electrical characteristic of the NPN transistor and to impart a long-term stability to the surface potential of the transistor. This is accomplished by heating the transistor to an elevated temperature significantly higher than the operating temperature range of the device while biasing the electrodes 20 and 31 negatively with respect to the collector member 12 as indicated. The two electrodes just mentioned may be connected to the same terminal of a voltage source. However, for some applications it may be desirable to connect those electrodes to sources supplying different values of biasing voltages so as to influence differently the semiconductor surfaces underlying those electrodes. The temperature-bias treatment is conducted in the manner previously explained in connection with the diodes of FIGS. 1A and 1C. This produces an electric field normal to the surface of the glass insulating layer 17 and a surface potential in the collector member 12 adjacent the interface with layer 17 which establishes the annular P-type inversion layer 26 thereat in the portion of the member 12 underlying the electrode 20. There is also produced by the same phenomenon an annular $P^+$-type semiconductor accumulation layer 33 in a surface portion of the P-type base region 13 underlying the electrode 31.

Figure 3B:
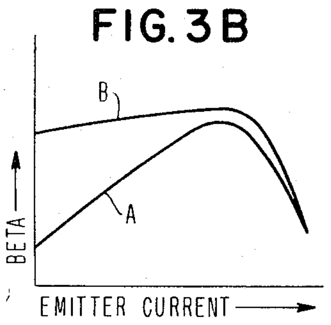
FIGS. 3B–3D are a group of curves employed in presenting graphically improved qualities imparted to the transistor of FIG. 3A by the method of this invention.
Figure 3C:
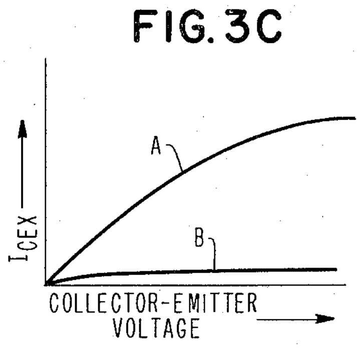
Figure 3D:
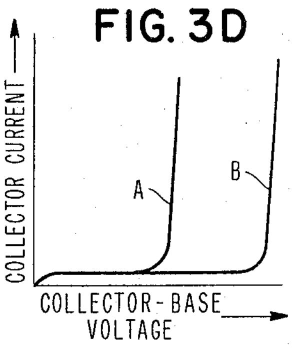

In the absence of the layer 33, curve A of FIG. 3B represents the variation of the current gain beta of the transistor 11 as the emitter current is varied. With the layer 33 covering a portion of the surface of the base member 13 near its surface, beta is improved or increased in the manner represented by curve B. Considering now the transistor parameter $I_{cex}$, representing the collector to emitter leakage current which flows with a very small forward bias on the emitter-base junction 13 and a reverse bias on the collector-base junction 14, that parameter varies with a change in the collector-emitter voltage in the fashion shown by curve A of FIG. 3C, in the absence of the P-type layer 26. However, the presence of that layer formed by the method of the present invention reduces the leakage current to the desired low and fairly constant value represented by curve B of FIG. 3C. Assuming again an absence of the layer 26, the less desirable collector current collector-to-base voltage characteristic is represented by curve A of FIG. 3D. However, the presence of layer 26 improves that parameter and provides the improved characteristic represented by curve B of FIG. 3D, which indicates that the reverse collector-base breakdown voltage is materially increased. Thus the temperature-bias treatment effects a permanent three-fold improvement in the electrical characteristics of the NPN transistor of FIG. 3A.

Figures 4A, 4B:
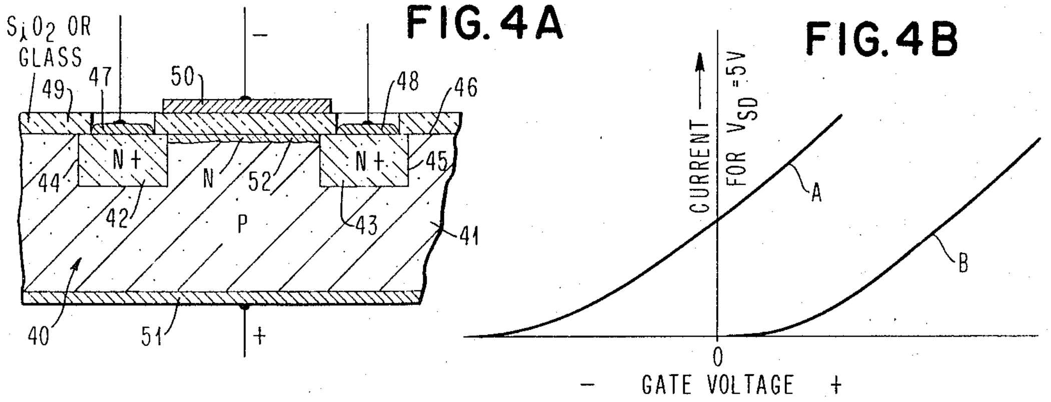
FIG. 4A is a sectional view of a field-effect transistor having a characteristic that is modified by the method of the invention.
FIG. 4B shows graphically that modification.

*Description of field effect transistor of FIG. 4A*

Referring now to FIG. 4A, there is represented an insulated-gate field-effect transistor 40 which has been treated in accordance with the method of the present invention. That transistor includes a first silicon semiconductor member 41 of the P-conductivity type and spaced second and third members 42 and 43 of the N conductivity type disposed in member 40 as by a diffusion operation and defining PN junctions 44 and 45 with that member. The various members have a coplanar surface 46 and the junctions 44 and 45 extend to that surface. Conventional source and drain connections 47 and 48 are made to members 42 and 43. A passivating layer 49 which may be of silicon dioxide or glass of the type mentioned above covers the junctions where they extend to the surface 46 and is also contiguous with that surface.

An area-type gate electrode 50 is applied to the layer 49 in a known manner and extends over the inner portions of the junctions 44 and 45 where they come to the surface 46 as represented. To permit the gate electrode to be biased negatively with reference to the semiconductor member 41 during the temperature-bias treatment, an electrode 51 is applied to the bottom surface of member 41. The fabrication of the transistor is such that an inversion layer 52 of the N conductivity type is formed on that surface of the P-type member intermediate the N-type members 42 and 43, thus establishing a current path between the source and drain connections. Accordingly, the field-effect transistor, in the absence of the temperature-bias treatment of the present invention, is one which is normally ON.

By the temperature-bias procedure of the present invention, with the gate electrode 50 biased negatively with respect to the P-type semiconductor member 41, it is possible to modify the surface potential of that portion of semiconductor member 41 between the N-type members 42 and 43 and effectively interrupt or eliminate the N-type inversion layer 52 or current channel between members 42 and 43. This converts the insulated-gate field-effect transistor 40 from a normally ON device to one which is normally OFF. Thereafter during operation of the device in a conventional manner, a positive-going signal applied to the gate electrode may be employed to create an N-type channel between members 42 and 43 and to modulate the conductivity of that channel in accordance with the amplitude of that signal. Curve A of FIG. 4B represents the current-gate voltage characteristic of the transistor (the voltage between the source and drain connections being 5 volts) prior to the temperature-bias treatment while curve B represents the corresponding characteristic for the normally OFF transistor created by the temperature-bias procedure.

Figure 5A:
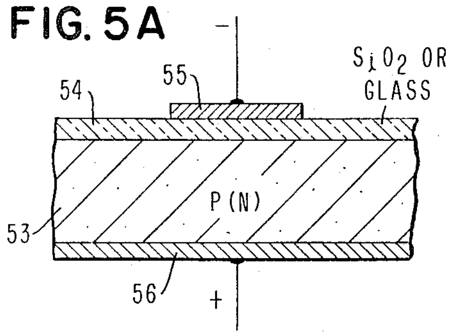
FIG. 5A is a sectional view of a semiconductor capacitor.

*Description of semiconductor capacitor of FIG. 5A*

A voltage-sensitive capacitor treated in accordance with the procedure of the invention is represented in FIG. 5A. It includes a semiconductor member 53, which for the present will be considered to be a P-type silicon, having a layer 54 of silicon dioxide or glass contiguous with a surface portion of that member. The glass may be of the type mentioned above or may be one of the type which is stable at temperatures above 150° C. Lead-alumino-borosilicate and zinc-alumino borosilicate glasses have proved satisfactory for the layer 54. A lead-alumino-borosilicate glass which has a good high stability and which is suitable in this environment contains 56.8% PbO, 3.9% $Al_2O_3$, 10.7% $B_2O_3$ and 28.6% $SiO_2$. A zinc-alumino-borosilicate glass which exhibits a higher temperature stability and may be employed in layer 54 includes 4.5% $Al_2O_3$, 26.5% $B_2O_3$, 10.1% $SiO_2$ and 58.9% ZnO. The semiconductor member may have a suitable thickness such as about 5 mils and a resistivity such as 2–5.5 ohm centimeters. Higher resistivity silicon members provide voltage-sensitive capaictors which exhibit greater capacitance swings for changes in applied voltage. When the layer 54 is made of silicon dioxide, it may have a thickness of a few thousand angstroms such as 2000–5000 angstroms, and when it consists of glass its thickness may be of the order of 5000 angstroms. The selected thickness of the layer 54 determines the capacitance and the range of capacitance variation which may be obtained. A first electrode 55 is applied in a conventional manner to the layer 54 while a second electrode 56 is applied to the semiconductor member 53.

Figure 5B:
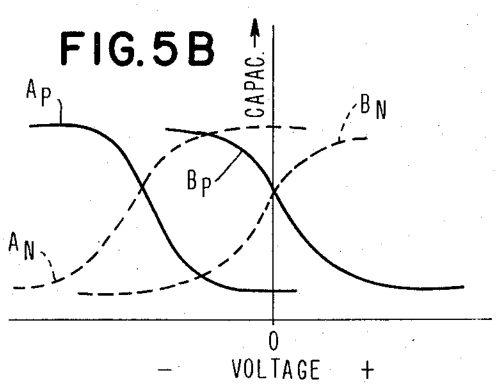
FIGS. 5B and 5C are a group of curves indicating beneficial changes in characteristics imparted to the capacitor of FIG. 5A by the method of the invention.

It will now be assumed that the capacitor of FIG. 5A includes a P-type silicon member 53 and a silicon dioxide layer 54 thereon. In the absence of the temperature-bias treatment, the capacitor may have a capacitance-voltage characteristic corresponding to curve $A_P$ of FIG. 5B. Such a capacitor responds only to a negative voltage over its useful operating range which corresponds to the sloping portion of curve $A_P$. The temperature-bias procedure of the invention is effective to shift that characteristic to the right so that it corresponds to curve $B_P$. During this treatment electrode 55 is biased negatively with respect to the member 53. The capacitor may now respond to both positive and negative values of a control voltage centered about zero volts, which may be desirable for some applications.

There has been described as an example the case where the capacitance transition is shifted in the positive voltage direction. However, by applying a positive voltage to the electrode 55 during the temperature-bias treatment, it is also possible to shift the curves in a negative voltage direction. This may be desirable for some applications.

Assuming now that the capacitor includes an N-type semiconductor member 53 and a silicon dioxide layer 54, broken-line curves $A_N$ and $B_N$, respectively, represent the capacitance-voltage characteristic of the device of FIG. 5A before and after the temperature-bias treatment of the invention.

Figure 5C:
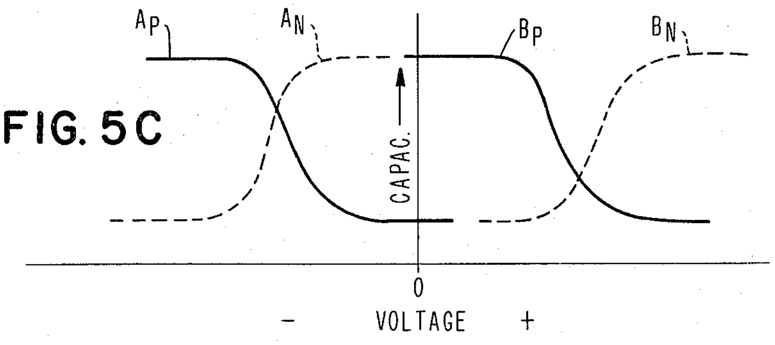

When layer 54 is made of glass and the semiconductor member 53 of the capacitor is P-type silicon, prior to the temperature-bias treatment the capacitor has the capacitance-voltage characteristic represented by curve $A_P$ of FIG. 5C. After the temperature-bias procedure, its characteristic is that shown by curve $B_P$, having been shifted to the right by an amount considerably greater than can be accomplished by the same treatment given to a capacitor having a silicon dioxide layer 54 under the terminal 55. The capacitor as so modified responds to positive values of control voltage.

Also, when the layer 54 consists of glass but the semiconductor member 53 of the capacitor is N-type silicon, the capacitance-voltage characteristic may be represented by the broken-line curves $A_N$ and $B_N$ for the respective conditions before and after the temperature-bias treatment. Again a large shift in the positive voltage direction is produced by the treatment, which shift is considerably greater than that which may be obtained when the layer 54 is made of silicon dioxide.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of improving at least one electrical characteristic of an electrical device which includes a semiconductor member and an insulating layer selected from the class consisting of glass and silicon oxide contiguous therewith comprising:
- heating said member and said layer to a temperature at least 50° C. higher than the operating temperature range of said device;
- applying a potential to an electrode on the insulating layer to produce at said higher temperature in said layer an electric field of an intensity effective permanently to fix over said operating range the surface potential of said member adjacent the interface of said member and said layer; and
- cooling said member and said layer to at most a temperature in said operating range of the device.

2. The method of improving at least one electrical characteristic of an electrical device which includes a semiconductor member and an insulating layer selected from the class consisting of glass and silicon oxide contiguous therewith comprising:
- heating said member and said layer to a temperature at least 50° C. higher than the operating temperature range of said device;
- applying a potential to an electrode on the insulating layer to produce at said higher temperature in said layer approximately normal to the thickness thereof an electric field of an intensity effective permanently to fix over said operating range at least one of the hole and electron density in a surface portion of said member adjacent the interface of said member and said layer; and
- cooling said member and said layer to at most a temperature in said operating range of the device.

3. The method of improving at least one electrical characteristic of an electrical device which includes a semiconductor member and an insulating layer selected from the class consisting of glass and silicon oxide contiguous therewith comprising:
- heating said member and said layer to a temperature at least 50° C. higher than the operating temperature range of said device;
- applying a potential to an electrode on the insulating layer to produce at said higher temperature in said layer an electric field of an intensity effective permanently to fix over said operating range at least one of the hole and electron density in a surface portion of said member adjacent the interface of said member and said layer; and
- cooling said member and said layer in said electric field to at most a temperature in said operating range of the device.

4. The method of improving at least one electrical characteristic of an electrical device which includes a silicon semiconductor member and an insulating layer selected from the class consisting of glass and silicon oxide contiguous therewith comprising:
- heating said member and said layer to a temperature of at least 150° C. which is significantly higher than the operating temperature range of said device;
- applying a potential to an electrode on the insulating layer to produce at said higher temperature in said layer an electric field of an intensity effective permanently to fix over said operating range the surface potential of said member adjacent the interface of said member and said layer; and
- cooling said member and said layer to at most a tempertature in said operating range of the device.

5. The method of improving at least one electrical characteristic of an electrical device which includes a semiconductor member and an insulating layer selected from the class consisting of glass and silicon oxide contiguous therewith comprising:
- heating said member and said layer to a temperature in the range of 50–250° C. higher than the operating temperature range of said device;
- applying a potential to an electrode on the insulating layer to produce at said higher temperature in said layer an electric field of an intensity effective permanently to fix over said operating range the surface potential of said member adjacent the interface of said member and said layer; and
- cooling said member and said layer to at most a temperature in said operating range of the device.

6. The method of improving at least one electrical characteristic of an electrical device which includes a silicon semiconductor member and an insulating layer selected from the class consisting of glass and silicon oxide contiguous therewith comprising:
- heating said member and said layer to a temperature above 250° C. which is significantly higher than the operating temperature range of said device;
- applying a potential to an electrode on the insulating layer to produce at said higher temperature in said layer an electric field of an intensity effective permanently to fix over said operating range the surface potential of said member adjacent the interface of said member and said layer; and
- cooling said member and said layer to at most a temperature in said operating range of the device.

7. The method of improving at least one electrical characteristic of an electrical device which includes a semiconductor member and an insulating layer selected from the class consisting of glass and silicon oxide contiguous therewith comprising:

heating said member and said layer to a tempera-significantly higher than the operating temperature range of said device;

applying a potential to an electrode on the insulating layer to produce at said higher temperature in said layer for at least an hour an electric field of an intensity effective permanently to fix over said operating range the surface potential of said member and said layer; and cooling said member and said layer to at most a temperature in said operating range of the device.

8. The method of improving at least one electrical characteristic of an electrical device which includes a semiconductor member and an insulating layer selected from the class consisting of glass and silicon oxide contiguous therewith comprising:

heating said member and said layer to a temperature significantly higher than the operating temperature range of said device;

applying a potential to an electrode on the insulating layer to produce at said higher temperature in said layer for a period having a length inversely proportional to the magnitude of said higher temperature an electric field of an intensity effective permanently to fix over said operating range at least one of the hole and electron density in a surface portion of said member adjacent the interface of said member and said layer; and cooling said member and said layer to at most a temperature in said operating range of the device.

9. The method of improving at least one electrical characteristic of an electrical device which includes a semiconductor member, an electrode and an insulating layer selected from the class consisting of glass and silicon oxide intermediate and contiguous with said member and said electrode comprising:

heating said member and said layer to a temperature significantly higher than the operating temperatures range of said device;

applying a voltage, the magnitude of which is proportional to the thickness of said layer, between said electrode and said member at said higher temperature to produce in said layer an electric field of an intensity permanently to fix over said operating range the surface potential of said member adjacent the interface of said member and said layer; and cooling said member and said layer to at most a temperature in said operating range of the device.

10. The method of improving at least one electrical characteristic of an electrical device which includes a semiconductor member, and electrode and an insulating layer selected from the class consisting of glass and silicon oxide intermediate and contiguous with said member and said electrode comprising:

heating said member and said layer to a temperature significantly higher than the operating temperature range of said device;

applying a voltage in the range of 10–30 volts between said electrode and said member at said higher temperature to produce in said layer an electric field of an intensity permanently to fix over said operating range the surface potential of said member adjacent the interface of said member and said layer; and cooling said member and said layer to at most a temperature in said operating range of the device.

11. The method of improving at least one electrical characteristic of an electrical device which includes a semiconductor member and an insulating layer selected from the class consisting of glass and silicon oxide contiguous therewith comprising:

applying an electrode to said layer;

heating said device to a temperature significantly higher than the operating temperature range thereof;

applying a voltage between said electrode and said member at said higher temperature to produce in said layer an electric field of an intensity permanently to fix over said operating range the surface potential of said member adjacent the interface of said member and said layer; and cooling said device to a temperature at most in said operating range of the device.

12. A semiconductor device which has an electrical characteristic improved according to the method of claim 1.

13. The method of improving at least one electrical characteristic of a semiconductor device which includes a first seminconductor member of one conductivity type, a second semiconductor member of the opposite conductivity type disposed in said first member and defining a PN junction therewith having a portion which extends to a surface of said members, and an insulating layer selected from the class consisting of glass and silicon oxide contiguous with said surface and covering said portion of said junction comprising:

applying an electrode to said layer over said portion of said junction and a portion of said first member;

heating said device to a temperature significantly higher than the operating temperatures range thereof;

applying a voltage between said electrode and said first member at said higher temperature to produce in said layer an electric field of an intensity permanently to fix over said operating range the surface potential of said first member adjacent the interface of said first member and said layer; and cooling said device to room temperature.

References Cited by the Examiner

UNITED STATES PATENTS 2,725,317 11/1955 Kleimack ------------ 148—13

DAVID L. RECK, *Primary Examiner.*

R. O. DEAN, *Assistant Examiner.*

UNITED STATES PATENT OFFICE
CERTIFICATE OF CORRECTION

Patent No. 3,303,059 February 7, 1967

Donald R. Kerr et al.

It is hereby certified that error appears in the above numbered patent requiring correction and that the said Letters Patent should read as corrected below.

Column 2, line 68, strike out "of to create a PN junction 14 that has a portion which" and insert the same after "there-" in line 71, same column 2; column 11, line 11, before "and", first occurrence, insert -- adjacent the interface of said member --.

Signed and sealed this 17th day of October 1967.

(SEAL)
Attest:

Edward M. Fletcher, Jr.
Attesting Officer

EDWARD J. BRENNER
Commissioner of Patents